United States Patent
Espedalen

(10) Patent No.: US 9,677,709 B2
(45) Date of Patent: Jun. 13, 2017

(54) SUB-SEA GAS RECOVERY SYSTEM

(71) Applicant: Siemens Aktiengesellschaft, München (DE)

(72) Inventor: Hans Espedalen, Kongsberg (NO)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/824,110

(22) Filed: Aug. 12, 2015

(65) Prior Publication Data

US 2016/0053940 A1 Feb. 25, 2016

(30) Foreign Application Priority Data

Aug. 22, 2014 (EP) ..................... 14181986

(51) Int. Cl.
| | |
|---|---|
| *B65B 1/04* | (2006.01) |
| *F17C 1/00* | (2006.01) |
| *E21B 41/00* | (2006.01) |
| *H05K 5/06* | (2006.01) |

(52) U.S. Cl.
CPC .......... *F17C 1/007* (2013.01); *E21B 41/0007* (2013.01); *H05K 5/068* (2013.01)

(58) Field of Classification Search
CPC ................ F17C 1/007; H05K 5/068
See application file for complete search history.

(56) References Cited

U.S. PATENT DOCUMENTS

| | | | |
|---|---|---|---|
| 2008/0302115 A1 | 12/2008 | Eknes et al. | |
| 2009/0289038 A1 | 11/2009 | Roenhovd | |
| 2012/0291688 A1* | 11/2012 | Dawes | B63C 11/00 114/312 |

FOREIGN PATENT DOCUMENTS

| | | |
|---|---|---|
| EP | 2487327 A1 | 8/2012 |
| EP | 2610881 A1 | 7/2013 |
| EP | 2902678 A1 | 8/2015 |
| EP | 2902679 | 8/2015 |
| EP | 291 6049 | 9/2015 |
| WO | WO 2011088840 A1 | 7/2011 |

OTHER PUBLICATIONS

Extended European Search Report dated Feb. 9, 2015.

* cited by examiner

*Primary Examiner* — Jason K Niesz
(74) *Attorney, Agent, or Firm* — Harness, Dickey & Pierce, P.L.C.

(57) ABSTRACT

A gas recovery system for sub-sea use includes a sub-sea canister and a gas recovery entity. A bladder arranged within an interior of a housing of the gas recovery entity is configured to receive gas from the sub-sea canister via a pipe when a pressure of the gas exceeds a threshold at a sub-sea site.

32 Claims, 3 Drawing Sheets

SUB-SEA GAS RECOVERY SYSTEM

PRIORITY STATEMENT

The present application hereby claims priority under 35 U.S.C. §119 to European patent application number EP14181986.2 filed Aug. 22, 2014, the entire contents of which are hereby incorporated herein by reference.

FIELD

At least one embodiment of the application generally relates to a gas recovery system for sub-sea use and at least one embodiment of the application generally relates to a method of recovering of gas from a pressurized compartment of a sub-sea canister. A bladder of a gas recovery entity receives the gas when a pressure of the gas within the pressurized compartment exceeds a threshold at a sub-sea site.

BACKGROUND

For subsea applications, for example subsea oil production, subsea energy transmission, and subsea telecommunications, equipment to be operated below sea level (sub-sea site) must be adapted to this harsh environment. A major obstacle in deep water is the extreme high pressure experienced by the equipment at these depths. Accordingly, pressure vessels, so-called sub-sea canisters, may be used to protect equipment at these depths from the high pressure by providing an inside pressure within a pressurized compartment of approximately one atmosphere corresponding approximately 100000 Pascal or 1 bar.

Sub-sea canisters used to maintain and simulate an ambient pressure similar to what is experienced at the surface (above sea-site) are also called one atmosphere chambers, vessels, or canisters. A common use for example in the oil industry for such a sub-sea canister is to protect pressure-sensitive components at the sub-sea site. In the event that a pressure canister leaks while at the sub-sea site and is then withdrawn back to the surface, it may contain gas at a pressure higher than the normal atmospheric pressure. When the pressure canister is retrieved from a depths of approximately 3000 meters to the surface, the pressure inside the canister may become extremely high, for example as high as 300 bar (30000000 Pa). When such a pressurized canister has been retrieved from the sub-sea site and is opened at the surface, accidents may happen. To achieve a more safe operation, a pressure relief valve may be installed.

However, in case the pressure relief valve opens, a gas within the pressurized compartment may escape. This may potentially cause damage to the environment and/or harm personnel operating the sub-sea canister.

SUMMARY

Therefore, a need exists to provide techniques of operating a sub-sea canister where the gas within the pressurized compartment cannot escape in case of overpressure. Further, a need exists to provide techniques of operating a sub-sea canister which allow to protect personal at an above-sea site from poisonous gas.

This need is met by the features of embodiments of the present application. The claims define embodiments.

According to an aspect of an embodiment of the present application, a gas recovery system for sub-sea use is provided. The gas recovery system comprises a sub-sea canister comprising a pressurized compartment. The pressurized compartment is configured to house equipment in an ambience filled with gas when the sub-sea canister is positioned at the sub-sea site. The gas recovery system further comprises a pipe connecting the sub-sea canister to a gas recovery entity. The gas recovery system further comprises the gas recovery entity which comprises a housing and a bladder which is arranged within an interior of the housing. The bladder is configured to receive the gas from the sub-sea canister via the pipe when a pressure of the gas exceeds a threshold at the sub-sea site.

According to a further aspect of an embodiment of the present application, a method of recovery of gas from a pressurized compartment of a sub-sea canister is provided. The method comprises selectively opening a pressure relief valve coupled to the pressurized compartment when a pressure of the gas within the pressurized compartment exceeds a threshold and when the sub-sea canister is positioned at a sub-sea site. The method further comprises a bladder arranged within an interior housing of the gas recovery entity receiving the gas from a sub-sea canister via the pressure relief valve and via a pipe when the pressure relief valve is open.

DETAILED DESCRIPTION OF THE EXAMPLE EMBODIMENTS

Figure 1:
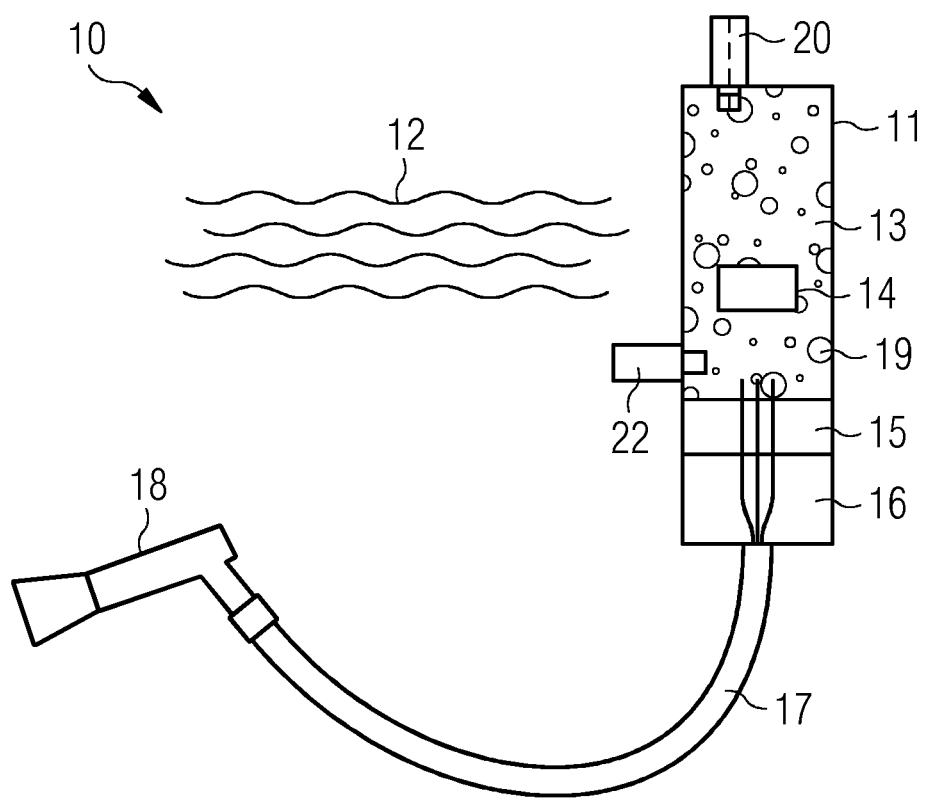
FIG. 1 illustrates schematically a sub-sea canister.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

According to an aspect of an embodiment of the present application, a gas recovery system for sub-sea use is provided. The gas recovery system comprises a sub-sea canister comprising a pressurized compartment. The pressurized compartment is configured to house equipment in an ambience filled with gas when the sub-sea canister is positioned at the sub-sea site. The gas recovery system further comprises a pipe connecting the sub-sea canister to a gas recovery entity. The gas recovery system further comprises the gas recovery entity which comprises a housing and a bladder which is arranged within an interior of the housing. The bladder is configured to receive the gas from the sub-sea canister via the pipe when a pressure of the gas exceeds a threshold at the sub-sea site.

E.g., the sub-sea site may below sea level. E.g., the sub-sea site may be more than 1000 meters below the surface or even further below the surface of the sea. The equipment may be electronic equipment; the sub-sea canister may provide respective interfaces for connecting the equipment with further external entities at the sub-sea site. E.g., the gas may be an insulating gas such as sulphurhexafluoride (SF6) in order to protect against electrical malfunction of electronic equipment within the pressurized compartment. E.g., the pipe can be implemented as double-metal piping. Thereby, a risk of a leak in the pipe may be reduced.

It is possible that the bladder is elastic/expandable; thereby, when receiving the gas from the sub-sea canister, the bladder may expand in order to absorb the entire or a large fraction of the gas previously filled to the pressurized compartment.

By checking the pressure of the gas against the threshold, overpressure may be detected. In particular, the overpressure may exist on retrieval of the gas recovery system to the above-sea site while the gas recover system is still at the sub-sea site, i.e., below the sea level. It is possible that the threshold is defined in absolute terms or in relative terms. E.g., the threshold may be defined against a reference pressure; e.g., the reference pressure may amount to approximately atmospheric pressure. For this, a further pressurized compartment may be provisioned to provide a reference pressure. However, it is also possible that the threshold is relatively defined against an ambient pressure at an outside of the gas recovery system or a declining pressure during retrieval from the sub-sea site to an above-sea site; in particular, at the sub-sea site, the ambient pressure may be significantly larger than the atmospheric pressure at the above-sea site.

The sub-sea canister may further comprise a pressure relief valve. It is possible that the pressure relief valve is configured to selectively open when the pressure of the gas exceeds the threshold. The pressure relief valve may be positioned at a top side of the pressurized compartment. Thereby, in case of a leak at the sub-sea site, it may be ensured that, e.g., during retrieval to the above-sea site, the gas is discharged from the pressurized compartment via the pressure relief valve—and not to sea water which entered the pressurized compartment due to the leak. E.g., the pressurized compartment may be of elongate shape; a height may be larger than a width and/or depth dimension. E.g., the pressure relief valve may be positioned at an upper end of the pressurized compartment; the upper end may correspond to the top side.

As the bladder selectively receives the gas when the pressure of the gas exceeds the threshold, the pressure of the gas may be higher than an ambient pressure at an outside of the gas recovery system, in particular when the gas recovery system is positioned at the sub-sea site.

By such techniques it is possible to prevent the gas previously included in the pressurized compartment of the sub-sea canister from escaping to the environment. At the same time, it is possible to reduce a pressure within the pressurized compartment if the pressure of the gas rises above a threshold, e.g., during retrieval to the above-sea site. This increases a safety in operation of the sub-sea canister.

The housing of the gas recovery system may comprise an orifice. The orifice may fluidly couple the interior of the housing with an outside of the gas recovery system. In other words it is possible that the interior of the housing of the gas recovery entity and the ambient pressure at the outside of the gas recovery system are pressure compensated. Because the gas may be pressurized against the ambient pressure at the sub-sea site, it is possible that the respective pressure difference drives the gas flow to the bladder. The bladder may expand to receive the gas; thereby, water may be expelled and displaced out of the interior of the housing of the gas recovery entity.

It is possible that the bladder of the gas recovery entity is made of a plastic or rubber material. Alternatively or additionally, it is also possible that the bladder of the gas recovery entity is partially filled with oil. The plastic material may provide flexibility to the bladder; thereby it is possible that the bladder expands when receiving the gas. E.g., the oil may be silicone oil and/or rubber oil and/or mineral oil. By providing the oil within the bladder, even at comparably high ambient pressures at the sub-sea site, a stability of the bladder may be preserved: as mentioned above, by providing the orifice it may be possible to compensate the pressure at the interior of the housing of the pressure relief entity against the ambient pressure. By providing the oil, the bladder is kept ready to receive the gas. Damage to the bladder may be prevented.

It is possible that the housing of the gas recovery entity is made from steel and/or a plastic material. Thereby, a rigidity or stiffness of the housing may be achieved.

The volume of the bladder of the gas recovery entity may amount to $1/2$-$1/20$ of the volume of the pressurized compartment of the sub-sea canister. Preferably, the volume of the bladder of the gas recovery entity amounts to $1/5$-$1/15$ of the volume of the pressurized compartment of the sub-sea canister. Most preferably the volume of the bladder of the gas recovery entity amounts to $1/10$ of the volume of the pressurized compartment of the sub-sea canister.

At a state when the gas is fully received within the bladder, the volume of the bladder (maximum volume) may correspond to the volume of the bladder in a fully expanded state. Further expansion may be limited by elongation properties of the material of the bladder not supporting further expansion and/or the limited dimensions of the interior of the housing of the gas recovery entity.

The expansion of the bladder when receiving the gas may be restricted by the bladder completely filling the interior of the housing. Further expansion may not be possible due to the rigidity of the housing and/or rigidity of the material of the bladder.

E.g., if oil is provided in the bladder, a volume of the oil may amount to less than 10% of the maximum volume of the bladder, preferably less than 5%, more preferably less than 2%.

Typically, the volume of the pressurized compartment may be designed such that—with no water leak—the gas is included in the pressurized compartment at atmospheric pressure. Then, by designing the maximum volume of the bladder to amount to a fraction of the volume of the pressurized compartment, the gas may be held in the bladder at an overpressure against atmospheric pressure at the above-sea site. The fraction of the volumes typically determines the overpressure of the gas in the bladder against atmospheric pressure: here, said overpressure/the volume of the bladder may be chosen small enough to avoid danger to personnel at the above-sea site on the one hand; one the other hand, said overpressure/the volume of the bladder may be chosen large enough to limit building space required for the gas recovery entity.

As mentioned above, it is possible that the sub-sea canister further comprises a pressure relief valve. The pressure relief valve may be coupled via the pipe to the gas recovery entity. The pressure relief valve may be further coupled to the pressurized compartment. The pressure relief valve may be configured to release the gas from the pressurized compartment of the sub-sea canister via the pipe to the bladder of the gas recovery entity if a pressure of the gas exceeds the threshold being at difference with respect to an ambient pressure at on outside of the gas recovery system.

Above, techniques have been illustrated which enable to recover the gas from the pressurized compartment if an overpressure of the gas against the threshold occurs, e.g., due to leakage of the pressurized compartment at the sub-sea site. Then, the gas is held and stored in the bladder. It may be desirable to recover the gas from the bladder, e.g., when the gas recovery system is at the above-sea site.

The sub-sea canister may further comprise a valve which is coupled via the pipe to the gas recovery entity. The valve may be configured to release the gas from the bladder via the pipe when the gas recovery system is positioned at the above-sea site.

Typically, as explained above, the gas may be stored within the bladder at an overpressure against atmospheric pressure. Then, it may be possible to exploit this overpressure against atmospheric pressure to drive the gas flow from the bladder and the valve to a compartment of a fluid transmission device. However, alternatively or additionally it is possible that the fluid transmission device comprises a pump for actively retrieving the gas from the bladder of the gas recovery entity.

It is possible that the pressure relief valve and the valve are positioned in a vicinity with respect to each other at a top side of the pressurized compartment. The pressure relief valve and the valve being positioned in vicinity with respect to each other at the top side of the pressurized compartment may correspond to the pressure relief valve and the valve being arranged at a distance which is small compared to outer dimensions of the pressurized compartment. E.g., the pressure relief valve and the valve may be housed within a common housing. A T-junction of the pipe may couple the pressure relief valve, the valve, and the bladder.

As shown above, via the valve it is possible to retrieve the gas from the bladder of the gas recovery entity. This may be necessary if leakage of the pressurized compartment has occurred at the sub-sea site. If no leakage of the sub-sea canister has occurred at the sub-sea site, it may be required to retrieve the gas from the pressurized compartment instead of from the bladder.

E.g., the sub-sea canister may further comprise a further valve coupled to the pressurized compartment. The further valve may be configured to release the gas from the pressurized compartment when the gas recovery entity is positioned the above-sea site. E.g., the valve and the further valve may be of the same build. It is possible that the valve and the further valve are positioned at substantially different positions with respect to an outside of the pressurized compartment. E.g., the further valve may be positioned at a bottom side of the pressurized compartment, the bottom side being substantially opposite to the top side. Via the further valve it is also possible to fill the gas into the pressurized compartment before submerging the sub-sea canister.

According to a further aspect of an embodiment of the present application, a method of recovery of gas from a pressurized compartment of a sub-sea canister is provided. The method comprises selectively opening a pressure relief valve coupled to the pressurized compartment when a pressure of the gas within the pressurized compartment exceeds a threshold and when the sub-sea canister is positioned at a sub-sea site. The method further comprises a bladder arranged within an interior housing of the gas recovery entity receiving the gas from a sub-sea canister via the pressure relief valve and via a pipe when the pressure relief valve is open.

The method may further comprise: retrieving the gas recovery system to an above-sea site. During lifting, the pressure of the gas may therefore rise against the ambient pressure at the outside of the gas recovery system; this may be due to the water only slowly leaving the pressurized compartment through the leak. This causes the opening of the pressure relief valve, e.g., if the threshold is a difference with respect to the ambient pressure at an outside of the gas recovery system.

For such a method, similar effects may be obtained as explained above with respect to the gas recovery system according to a further aspect of an embodiment of the present application.

It is possible that the method further comprises displacing water out of the interior of the housing of the gas recovery entity via an orifice when the bladder expands and receives the gas from the sub-sea canister.

In other words, by provisioning the orifice, the interior of the housing can be pressure compensated against the ambient pressure. This allows the bladder to expand when receiving the gas.

The method may further comprise opening the valve coupled to the pipe when the sub-sea canister is positioned at an above-sea site. The method may further comprise receiving the gas from the bladder of the gas recovery entity via the pipe and via the valve when the valve is opened.

E.g., the valve may be opened manually. As mentioned above, it is possible to store the gas within the bladder at an overpressure against atmospheric pressure. This overpressure can be exploited to drive the gas flow from the bladder at the above-sea site. Additionally or alternatively, a pump may be operated to drive the gas flow.

It is possible that the method further comprises opening a further valve which is coupled to the pressurized compartment when the sub-sea canister is positioned at the above-sea site. It is possible that the method further comprises receiving the gas from the pressurized compartment via the further valve when the further valve is open. In such a manner, it is possible to receive the gas from the pressurized compartment in a situation where no leakage of the pressurized compartment has occurred; i.e., when the opening of the pressure relief valve did not occur.

The gas recovery system according to a further aspect of an embodiment may be configured to execute the method of recovering gas according to the presently discussed aspect.

According to a further aspect of an embodiment, a gas recovery entity for sub-sea use is provided. The gas recovery entity comprises a housing and a bladder arranged within an interior of the housing. The bladder is configured to receive gas from a pressurized compartment of a sub-sea canister via a pipe when a pressure of the gas inside the pressurized compartment exceeds a threshold at a sub-sea site.

It is to be understood that the features mentioned above and features yet to be explained below can be used not only in the respective combinations indicated, but also in other combinations or in isolation, without departing from the scope of the present invention. Features of the above-mentioned aspects and embodiments may be combined with each other in other embodiments. In particular, it is possible that features discussed with respect to the gas recovery system according to an aspect are used also for the gas recovery entity according to a further aspect.

Hereinafter, techniques of safely taking care of gas from a leaking sub-sea canister are described. A respective gas recovery system allows protecting personnel from poisonous or flammable gas employed in the sub-sea canister. Gas which potentially causes harm to the environment is prevented from escaping to the atmosphere.

Typically, sub-sea canisters are provided with a pressure relief valve. When a leak occurs at a sub-sea site, seawater can enter a pressurized compartment of the sub-sea canister. Gas which is included in the pressurized compartment is compressed by the entering seawater; a gas bubble forms at a top side of the pressurized compartment. Without a pressure relief valve, the sub-sea canister—due to the pressurized gas—is a potential bomb when retrieved or lifted to the above-sea site. If a leak occurs with a gas-filled sub-sea canister, this gas may harm personnel or escape to atmosphere.

By providing a gas recovery entity which comprises a bladder configured to receive the gas from the sub-sea canister when a pressure of the gas exceeds a threshold at the sub-sea site, such limitation and drawbacks can be overcome by storing the gas.

FIG. 1 shows schematically a sub-sea canister 11 in a typical sub-sea environment 10. The sub-sea canister 11 may be used for housing components or equipment 14 in a pressurized compartment 13 for protecting the equipment 14 from high pressure present in deep sea water at a sub-sea site 12. The pressurized compartment 13 is filled with gas 19, e.g., with isolation gas or protective gas. For coupling the equipment 14 with outside equipment, the sub-sea canister 11 comprises a port 16, for example an oil-filled pressure compensated chamber 16, and an electrical penetrator 15 providing electrical lines arranged in an oil-filled conduit 17. The other end of the conduit 17 may comprise a connector 18 for coupling the conduit to another sub-sea or land-based equipment. A valve 22 is provided to allow filling and retrieving of the gas 19 to and from the pressurized compartment 13 during normal operation at an above-sea site. E.g., the valve 22 may be according to the valve described in European Patent Application EP 14 157 554.8, the entire contents of which are hereby incorporated herein by reference.

The sub-sea canister 11 may be arranged in deep water, for example at a sub-sea site 12 in a depth of 3000 meters. Therefore, a pressure exerted on the sub-sea canister 11 by the seawater at the sub-sea site 12 may become as large as for example 300 bar. For enabling operation of standard equipment 14 in such an environment, the sub-sea canister 11 may provide a pressure in the pressurized compartment 13 of approximately one bar (atmospheric pressure). In the event that the sub-sea canister 11 leaks while being arranged at the sub-sea site 12 and is then lifted and retrieved from the sub-sea site 12 to an above-sea site having atmospheric pressure, it may still contain the pressurized gas at a high pressure.

Such a sub-sea canister 11 including the pressurized gas 19 may explode when being exposed or opened. Therefore, a pressure relief valve (PRV) 20 is arranged at a top-side of the elongate sub-sea canister 11. E.g., the PRV 20 may be according to the PRVs described in European patent application EP 14 153 085.7 and EP 14 153 087.3, the entire contents of each of which are hereby incorporated herein by reference. When a pressure difference between a pressure inside the pressurized compartment 13 and an ambient pressure at an outside of the sub-sea canister 10 exceeds a threshold, the PRV 20 opens and the pressurized gas from the pressurized compartment 13 of the sub-sea canister 11 is released.

Figure 2:
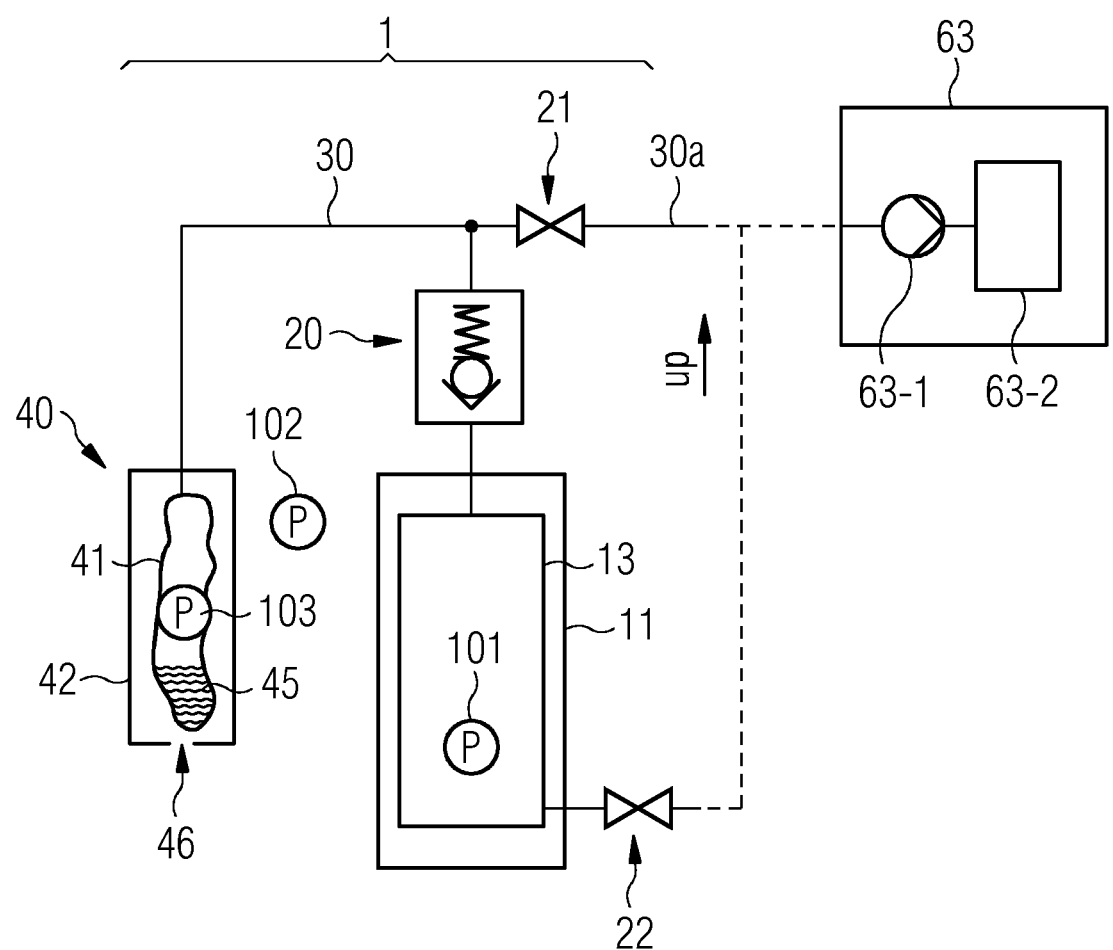
FIG. 2 illustrates schematically a gas recovery system configured to receive gas from the sub-sea canister and store the gas in a bladder of a gas recovery entity.

To avoid that the gas 19 escapes to the environment when the PRV 20 opens, a gas recovery system 1 can be employed (cf. FIG. 2). Here, a pipe 30 connects the sub-sea canister 11 to a gas recover entity 40. The gas recovery entity 40 comprises a housing 42 and the bladder 41 arranged within an interior of the housing 42. The bladder 41 can therefore receive the gas 19 from the sub-sea canister 11 via the pipe 30 when the PRV 20 opens. In the scenario of FIG. 2, the PRV 20 is configured to release the gas 19 from the pressurized compartment 13 of the sub-sea canister 11 if a pressure 101 of the gas 19 inside the pressurized compartment 13 exceeds a threshold which is defined as a difference of a pressure 101 against the ambient pressure 102 at an outside of the gas recovery system 1. Such a situation may occur, e.g., when at a certain depth at the sub-sea site 12-1 a leakage of the pressurized compartment 13 occurs and seawater enters the pressurized compartment 13 thereby compressing the gas 19. Then, the volume of the gas 19 within the pressurized compartment 13 is restricted into bubble forms at the top side of the pressurized compartment 13 where the PRV 20 is arranged. Once the gas recovery system 1 is lifted, the pressure 101 rises against the ambient pressure 102 and eventually crosses the threshold.

As can be seen from FIG. 2, the housing 42 of the gas recovery entity comprises an orifice 46 which fluidly couples the interior of the housing 42 with an outside of the gas recovery system 1. Therefore, a pressure at the interior of the housing 42 of the gas recovery entity 40 is pressure compensated with the ambient pressure 102.

When the pressure relief valve 20 is open, the bladder 41 receives the gas 19 from the sub-sea canister 11 via the PRV 20 and via the pipe 30. A gas flow is driven by the overpressure of the pressure 101 of the gas 19 against the ambient pressure 102 which is the pressure at the interior of the housing 42 of the gas recovery entity 40. Then, the bladder 41 expands and displaces sea water out of the interior of the housing 42 of the gas recovery entity 40 via the orifice 46. In order to prevent the bladder 41 from damage in an un-expanded state with no gas 19 inside, oil 45 is provided within the bladder 41. It is possible that the bladder 41 is made from a plastic material. Further, the housing 42 of the gas recovery entity 40 can be made from steel and/or plastic material. Thereby, excess expansion of the bladder 41 when receiving the gas 19 can be prevented by the elongation properties of the plastic material of the bladder 41 and/or the dimensions of the housing 42 of the gas recovery entity 40.

As can be seen from FIG. 2, a maximum dimension of the volume of the bladder 41 is smaller than a dimension of the pressurized compartment 13 of the sub-sea canister 11. Therefore, once the gas 19 is received by the bladder 41 and when the gas recovery system 1 is at the above-sea site, a pressure 103 of the gas 19 inside the bladder 41 will be larger than atmospheric pressure.

Typically, the pressure 101 of the gas 19 inside the pressurized compartment 13 when no leakage has occurred will amount to atmospheric pressure. E.g., the volume of the bladder 41 in the gas recovery entity 40 may amount to ½-1/20 of the volume of the pressurized compartment 13 of the sub-sea canister 11 when the gas 19 is received in the bladder 41. Preferably, this volume amounts to ⅕-1/15 of the volume of the pressurized compartment 13, most preferably to 1/10 of the volume of the pressurized compartment 13. A ratio of the volumes of the bladder 41 of the pressurized compartment 13 corresponds to a resulting overpressure of the pressure 103 of the gas 19 in the bladder 42 against atmospheric pressure at the above-sea site.

Further illustrated in FIG. 2 is a valve 21 which is coupled via the pipe 30 to the gas recovery entity 40. When the gas recovery system 1 is at the above-sea site, it is possible to open the valve 21 to thereby release the gas from the bladder 41 via a hose 30a and store the gas in the compartment 63-2 of a fluid transmission device 63.

If the gas 19 was not expelled from the pressurized chamber 13, it is possible to retrieve the gas 19 from the pressurized chamber 13 via the valve 22, e.g., by operating the pump 63-1.

As can be seen from FIG. 2, both the PRV 20 as well as the valve 21 are arranged in a vicinity with respect to each other at the top side of the pressurized compartment 13.

Figure 3:
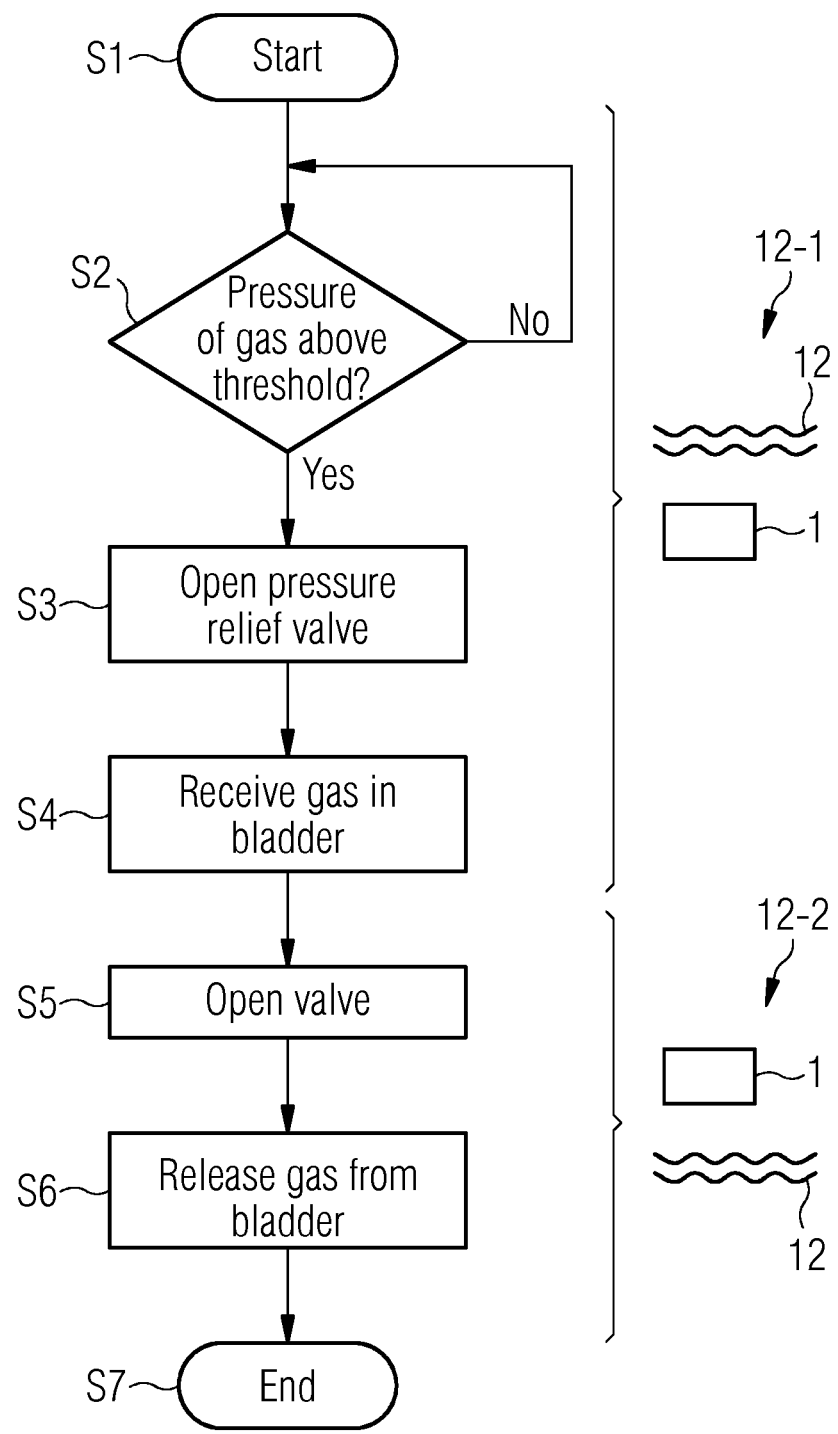
FIG. 3 is a flowchart of a method of recovery of gas from the sub-sea canister.

FIG. 3 is a flowchart of a method of recovering gas from a pressurized compartment according to various embodiments. The method starts with step S1.

As can be seen from FIG. 3, steps S2-S4 occur below sea-level at the sub-sea site 12; here, the gas recovery system 1 is below sea level. In contrast, steps S5 and S6 occur at the above-sea site when the gas recovery system 1 is lifted.

In step S2 it is checked whether the pressure 101 of the gas 19 inside the pressurized chamber 13 of the sub-sea canister 11 exceeds a threshold; the threshold is typically defined against the ambient pressure 102. E.g., when retrieving or lifting the gas recovery system 1 from a ground position, the pressure 101 will rise against the ambient pressure 102 if a leak has occurred.

If the pressure 101 is larger than the threshold, in step S3 the PRV 20 opens and the gas 19 escapes from the pressurized chamber 13. The gas is guided via the pipe to the bladder 41 and received there (step S4).

In step S5—at the above-sea site 12a—the valve 21 is opened to recover the gas 19 from the bladder 41 (step S6). For this, the pump 63-1 may be employed.

The method ends in step S7.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A gas recovery system for sub-sea use, the gas recovery system comprising:
   a sub-sea canister including a pressurized compartment, the pressurized compartment being configured to house equipment in an ambience filled with gas when the sub-sea canister is positioned at a sub-sea site;
   a pipe, connecting the sub-sea canister to a gas recovery entity;
   a housing; and
   a bladder, arranged within an interior of the housing, the bladder being configured to receive the gas from the sub-sea canister via the pipe when a pressure of the gas inside the pressurized compartment exceeds a threshold at the sub-sea site, wherein the housing of the gas recovery system includes an orifice to fluidly couple an interior of the housing with an outside of the gas recovery entity.

2. The gas recovery system of claim 1,
   wherein the bladder of the gas recovery entity is at least one of made from a plastic material and is partially filled with oil.

3. The gas recovery system of claim 1,
   wherein the housing of the gas recovery entity is made from at least one of steel and a plastic material.

4. The gas recovery system of claim 1,
   wherein a volume of the bladder of the gas recovery entity amounts to ½-1/20 of a volume of the pressurized compartment of the sub-sea canister when the gas is received in the bladder.

5. A gas recovery system for sub-sea use, the gas recovery system comprising:
   a sub-sea canister including a pressurized compartment, the pressurized compartment being configured to house equipment in an ambience filled with gas when the sub-sea canister is positioned at a sub-sea site;
   a pipe, connecting the sub-sea canister to a gas recovery entity;
   a housing; and
   a bladder, arranged within an interior of the housing, the bladder being configured to receive the gas from the sub-sea canister via the pipe when a pressure of the gas inside the pressurized compartment exceeds a threshold at the sub-sea site, wherein the sub-sea canister further comprises a pressure relief valve coupled via the pipe to the gas recovery entity and further coupled to the pressurized compartment, and wherein the pressure relief valve is configured to release the gas from the pressurized compartment of the sub-sea canister via the pipe to the bladder of the gas recovery entity if a pressure of the gas inside the pressurized compartment exceeds the threshold being a difference with respect to an ambient pressure at an outside of the gas recovery system.

6. A gas recovery system for sub-sea use, the gas recovery system comprising:
a sub-sea canister including a pressurized compartment, the pressurized compartment being configured to house equipment in an ambience filled with gas when the sub-sea canister is positioned at a sub-sea site;
a pipe, connecting the sub-sea canister to a gas recovery entity;
a housing; and
a bladder, arranged within an interior of the housing, the bladder being configured to receive the gas from the sub-sea canister via the pipe when a pressure of the gas inside the pressurized compartment exceeds a threshold at the sub-sea site,
wherein the sub-sea canister further comprises a valve coupled via the pipe to the gas recovery entity, and
wherein the valve is configured to release the gas from the bladder via the pipe when the gas recovery system is positioned at an above-sea site.

7. The gas recovery system of claim 5,
wherein the pressure relief valve and the valve are positioned in a vicinity with respect to each other at a top side of the pressurized compartment.

8. The gas recovery system of claim 6,
wherein the sub-sea canister further comprises a further valve coupled to the pressurized compartment, and
wherein the further valve is configured to release the gas from the pressurized compartment when the gas recovery system is positioned at an above-sea site.

9. A method of recovering gas from a pressurized compartment of a sub-sea canister, the method comprising:
selectively opening a pressure relief valve coupled to the pressurized compartment when a pressure of the gas within the pressurized compartment exceeds a threshold and when the sub-sea canister is positioned at a sub-sea site; and
receiving the gas from the sub-sea canister, at a bladder arranged within an interior of a housing of a gas recovery entity, via the pressure relief valve and via a pipe when the pressure relief valve is open.

10. The method of claim 9, further comprising:
displacing water out of the interior of the housing of the gas recovery entity via an orifice when the bladder expands and receives the gas from the sub-sea canister.

11. The method of claim 9, further comprising:
opening a valve coupled to the pipe when the sub-sea canister is positioned at an above-sea site; and
receiving the gas from the bladder of the gas recovery entity via the pipe and via the valve when the valve is open.

12. The method of claim 11, further comprising:
opening a further valve coupled to the pressurized compartment when the sub-sea canister is positioned at an above-sea site; and
receiving the gas from the pressurized compartment via the further valve when the further valve is open.

13. The method of claim 9,
wherein the threshold is a difference with respect to an ambient pressure at an outside of the gas recovery system.

14. A gas recovery entity for sub-sea use at a sub-sea site and connectable to a sub-sea canister via a pipe, the sub-sea canister including a pressurized compartment, the pressurized compartment being configured to house equipment in an ambience filled with gas when the sub-sea canister is positioned at a sub-sea site, the gas recovery entity comprising:
a housing; and
a bladder arranged within an interior of the housing and configured to receive gas from a pressurized compartment of the sub-sea canister via a pipe when a pressure of the gas inside the pressurized compartment exceeds a threshold at the sub-sea site, wherein the housing of the gas recovery entity includes an orifice to fluidly couple an interior of the housing with an outside of the gas recovery entity.

15. The gas recovery system of claim 4,
wherein a volume of the bladder of the gas recovery entity amounts to $\frac{1}{5}$-$\frac{1}{15}$ of a volume of the pressurized compartment of the sub-sea canister when the gas is received in the bladder.

16. The gas recovery system of claim 15,
wherein a volume of the bladder of the gas recovery entity amounts to $\frac{1}{10}$ of a volume of the pressurized compartment of the sub-sea canister when the gas is received in the bladder.

17. The gas recovery system of claim 1,
wherein a volume of the bladder of the gas recovery entity amounts to $\frac{1}{2}$-$\frac{1}{20}$ of a volume of the pressurized compartment of the sub-sea canister when the gas is received in the bladder.

18. The gas recovery system of claim 2,
wherein a volume of the bladder of the gas recovery entity amounts to $\frac{1}{2}$-$\frac{1}{20}$ of a volume of the pressurized compartment of the sub-sea canister when the gas is received in the bladder.

19. The gas recovery system of claim 3,
wherein a volume of the bladder of the gas recovery entity amounts to $\frac{1}{2}$-$\frac{1}{20}$ of a volume of the pressurized compartment of the sub-sea canister when the gas is received in the bladder.

20. The gas recovery system of claim 6,
wherein the pressure relief valve and the valve are positioned in a vicinity with respect to each other at a top side of the pressurized compartment.

21. The gas recovery system of claim 7,
wherein the sub-sea canister further comprises a further valve coupled to the pressurized compartment, and
wherein the further valve is configured to release the gas from the pressurized compartment when the gas recovery system is positioned at an above-sea site.

22. The method of claim 10, further comprising:
opening a valve coupled to the pipe when the sub-sea canister is positioned at an above-sea site; and
receiving the gas from the bladder of the gas recovery entity via the pipe and via the valve when the valve is open.

23. The method of claim 10, further comprising:
opening a further valve coupled to the pressurized compartment when the sub-sea canister is positioned at an above-sea site; and
receiving the gas from the pressurized compartment via the further valve when the further valve is open.

24. The method of claim 10,
wherein the threshold is a difference with respect to an ambient pressure at an outside of the gas recovery system.

25. The method of claim 11, further comprising:
opening a further valve coupled to the pressurized compartment when the sub-sea canister is positioned at an above-sea site; and
receiving the gas from the pressurized compartment via the further valve when the further valve is open.

26. The method of claim 25,
wherein the threshold is a difference with respect to an ambient pressure at an outside of the gas recovery system.

27. The method of claim 9, wherein the housing of the gas recovery entity includes an orifice to fluidly couple an interior of the housing with an outside of the gas recovery entity.

28. The method of claim 9, further comprising:
opening a valve coupled to the pressurized compartment when the sub-sea canister is positioned at an above-sea site; and
receiving the gas from the pressurized compartment via the valve when the valve is open.

29. The gas recovery system of claim 5, wherein the housing includes an orifice to fluidly couple an interior of the housing with an outside of the gas recovery entity.

30. The gas recovery system of claim 5,
wherein the bladder of the gas recovery entity is at least one of made from a plastic material and is partially filled with oil.

31. The gas recovery system of claim 6, wherein the housing includes an orifice to fluidly couple an interior of the housing with an outside of the gas recovery entity.

32. The gas recovery system of claim 6,
wherein the bladder of the gas recovery entity is at least one of made from a plastic material and is partially filled with oil.

* * * * *